US008040745B2

(12) United States Patent
Shibata

(10) Patent No.: US 8,040,745 B2
(45) Date of Patent: Oct. 18, 2011

(54) STACKED MEMORY AND FUSE CHIP

(75) Inventor: Kayoko Shibata, Chuo-ku (JP)

(73) Assignee: Elpida Memory, Inc., Tokyo (JP)

( * ) Notice: Subject to any disclaimer, the term of this patent is extended or adjusted under 35 U.S.C. 154(b) by 338 days.

(21) Appl. No.: 12/392,547

(22) Filed: Feb. 25, 2009

(65) Prior Publication Data
US 2009/0213634 A1    Aug. 27, 2009

(30) Foreign Application Priority Data
Feb. 26, 2008    (JP) .................................. 2008-045316

(51) Int. Cl.
*G11C 7/00* (2006.01)
(52) U.S. Cl. ......................... 365/200; 365/225.7; 365/63
(58) Field of Classification Search .................. 365/200, 365/225.7, 63
See application file for complete search history.

(56) References Cited

U.S. PATENT DOCUMENTS

| 7,053,470 B1* | 5/2006 | Sellers et al. | 257/678 |
| 7,222,274 B2* | 5/2007 | Combs et al. | 714/721 |
| 2007/0075396 A1* | 4/2007 | Ogishima | 257/529 |

FOREIGN PATENT DOCUMENTS
JP    2004-119458 A    4/2004
* cited by examiner

*Primary Examiner* — Son Dinh
*Assistant Examiner* — Nam Nguyen
(74) *Attorney, Agent, or Firm* — Sughrue Mion, PLLC

(57) ABSTRACT

A stacked memory comprises one or more memory core chips and a fuse chip. Each of the memory core chips has a memory cell array including spare memory cells for replacing defective memory cells. The fuse chip has a fuse unit including a plurality of fuse elements whose electrical cut state corresponding to a replacement with the spare memory cells can be set. Also the fuse chip has a redundancy cell control circuit for controlling a redundancy cell operation of the defective memory cells based on state information of the fuse unit.

19 Claims, 13 Drawing Sheets

STACKED MEMORY AND FUSE CHIP

BACKGROUND OF THE INVENTION

1. Field of the Invention

The present invention relates to a stacked memory having a memory core chip, and particularly relates to a stacked memory configured to relieve defective memory cells by replacing them with spare memory cells by using fuses.

2. Description of Related Art

Generally, a memory chip such as a DRAM (Dynamic Random Access Memory) employs a structure in which defective memory cells generated in a memory cell array are replaced with spare memory cells and are relieved thereby. Therefore, a large number of fuse elements are mounted on the memory chip, and the control is performed based on an electrical cut state of each fuse element when a defective memory cell is replaced with a spare memory cell. The fuse elements are generally disposed in an area where no memory cell array is disposed on the memory chip. The above-mentioned memory chip formed by stacking memory chips employs the same technique. Further, through electrodes for signal transmission and power supply connection need to be formed in the stacked memory.

A planar structure of a memory core chip stacked in the stacked memory will be described using FIGS. 12A and 12B. For comparison, FIG. 12A shows a planar structure of a general DRAM chip Ca. The DRAM chip Ca in FIG. 12A has a memory cell array area Ra including a large number of memory cells, a fuse area Rb where a large number of fuses are formed, and a test pad area Rc where a large number of test pads used in a test of the DRAM chip Ca are formed. On the other hand, FIG. 12B shows a planar structure of a memory core chip Cb which is a redesign of the DRAM chip Ca of FIG. 12A specifically for the stacked memory. The memory core chip Cb of FIG. 12B has a through electrode area Rd where the above through electrodes are formed, in addition to the memory cell array area Ra, the fuse area Rb and the test pad area Rc as in FIG. 12A.

Further, FIGS. 13A to 13D show a structure of the stacked memory in which the memory core chips shown in FIGS. 12A and 12B are stacked. As shown in FIG. 13A, a memory core wafer W in which a plurality of memory core chips C are formed is prepared, and there are formed circuit portions 10 including fuses, circuit elements, metal wiring and the like, and through electrodes 11, on the memory core wafer W. Then, after electrodes 12 for external connection is formed on the memory core wafer W as shown in FIG. 13B, the memory core wafer W is diced and the respective memory core chips C are separated as shown in FIG. 13C. Thereafter, stacking process of the memory core chips C is performed as shown in FIG. 13D, electrodes 12 of the memory core chips C are connected to each other so as to function as chip-to-chip connection portions 13, and the stacked memory is completed by mounting an interposer chip IC of the lowermost layer.

The conventional memory core chip Cb of FIG. 12B needs an extra space corresponding to the through electrode area Rd in comparison with the general DRAM chip Ca, as shown with a dotted line in FIG. 12A. Thereby, there arises a problem of an increase in chip size of the memory core chip Cb of the stacked memory in comparison with the general DRAM chip Ca.

Further, a structure has been proposed in which a fuse unit is mounted on a chip different from the memory core chip for the purpose of decreasing the chip size (for example, see Laid-open Japanese Patent Publication No. 2004-119458). However, in such a structure, a large number of chip-to-chip connection signals are required between the chip on which the fuse unit is mounted and the memory core chip, and there arises a problem of an increase in area for forming the through electrodes penetrating the respective chips. This problem becomes pronounced when the capacity of the memory core chip is larger and sufficient redundancy cell control is implemented.

Furthermore, in a manufacturing process of the conventional stacked memory, fuse trimming for replacing defective memory cells with spare memory cells is performed after a wafer test. Then, stacking process of the chips is performed after dicing the chips of the stacked memory. In this case, if a defective memory cell is generated in the stacking process, the fuse trimming has been already completed, so that a problem arises in that the replacement with the spare memory cell cannot be performed at this point.

SUMMARY

The present invention seeks to solve the above problems and provides a stacked memory in which a fuse unit and a redundancy cell control circuit used for replacement with spare memory cells are mounted on a fuse chip, and which is capable of avoiding an increase in chip size by connecting mutually between the fuse chip and a memory core chip using a small number of chip-to-chip connection signals and is capable of relieving defective memory cells generated after wafer stacking.

In one of aspects of the invention, there is provided a stacked memory comprising: one or more memory core chips, each of the chips having a memory cell array including spare memory cells replacing defective memory cells; and a fuse chip having a fuse unit including a plurality of fuse elements, electrical states of the fuse elements corresponding to a defective address of one of the defective memory cells, and having a redundancy cell control circuit controlling a redundancy cell operation of the defective memory cell based on the electrical state of the fuse elements.

According to the aspects of the invention, the fuse unit and the redundancy cell control circuit are configured in the fuse chip which is separated from the memory core chip, and the defective spare memory cells are replaced with the spare memory cells based on a control signal. Thus, since the fuse unit and the redundancy cell control circuit are not required to be mounted on the memory core chip, an increase in area can be suppressed and the number of chip-to-chip connection signals between the memory core chip and the fuse chip can be reduced.

The present invention can be applied to a semiconductor memory device such as a DRAM, and applied to various semiconductor memory devices capable of replacing the defective memory cells with spare memory cells similarly as the DRAM. For example, a semiconductor memory device such as SRAM and PRAM can be used. Further, fuses or anti-fuses can be used as the fuse elements of the fuse chip. Furthermore, fuse elements used for other applications (for example, adjustment of an internal power supply voltage or adjustment of a period of s self refresh) can be included in the fuse unit as well as the fuse elements used for the redundancy cell control.

In another aspect of the invention, there is provided a fuse chip comprising a fuse unit including a fuse unit including a plurality of fuse elements, electrical states of the fuse elements corresponding to a defective address of the defective memory cell, and having a redundancy cell control circuit controlling a redundancy cell operation of the defective memory cell based on the electrical state of the fuse elements.

As described above, according to the present invention, the fuse unit and the redundancy cell control circuit are configured in the fuse chip separate from the memory core chip, and a control signal from the redundancy cell control circuit is supplied from the fuse chip to the memory core chip through the through electrodes, so that an increase in the area of the memory core chip can be suppressed. In this case, the area corresponding to the fuses and the peripheral circuit assumed in the memory core chip can be reduced, while the through electrodes can be formed in this area. Generally, the area of the fuse unit and the peripheral redundancy cell control circuit occupies about under 4% of the entire chip, the area can be drastically reduced in the memory core chip of the present invention relative to the memory core chip having the fuse area, the peripheral circuit area and through electrode area. Further, according to the present invention, since a complicated control for the redundancy cell operation is performed in the fuse chip, the number of signals supplied from the fuse chip to the memory core chip can be reduced, and an increase in area can be achieved by forming through electrodes for a small number of the chip-to-chip connection signals. Furthermore, according to the present invention, since fuse trimming for the fuse chip can be performed after stacking process of the stacked memory, defective memory cells generated after the stacking process can be relieved.

BRIEF DESCRIPTION OF THE DRAWINGS

The above featured and advantages of the present invention will be more apparent from the following description of certain preferred embodiments taken in conjunction with the accompanying drawings, in which.

DETAILED DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposes. In the following, two embodiments in which the present invention is applied to a stacked memory having DRAM chips will be described.

First Embodiment

Figure 1:
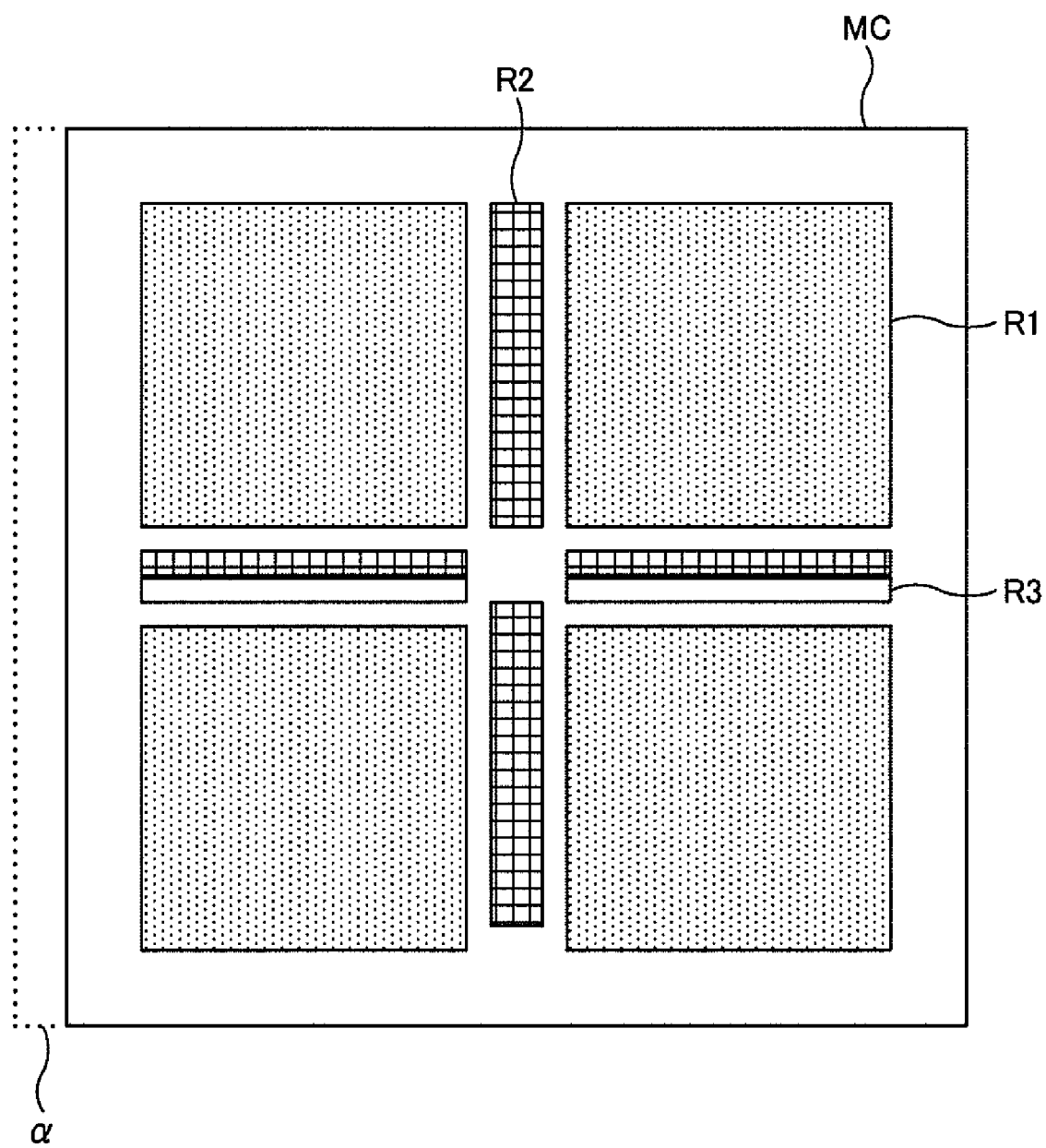
FIG. 1 is a diagram showing a planar structure of a memory core chip MC of a stacked memory of a first embodiment.
Figure 2:
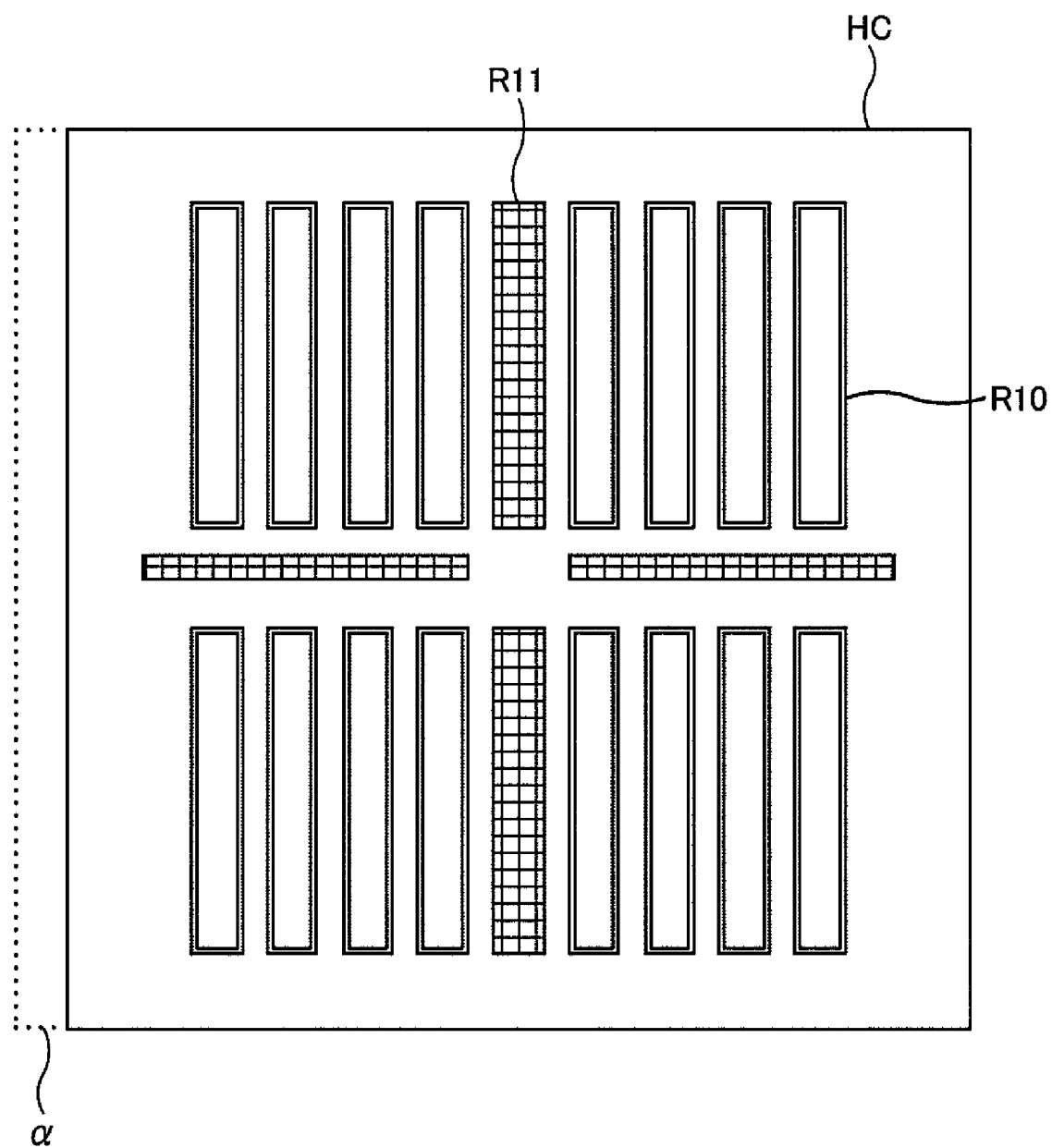
FIG. 2 is a diagram showing a planar structure of a fuse chip of the stacked memory of the first embodiment.

A stacked memory of the first embodiment is configured to have a plurality of memory core chips functioning as the DRAM chips and a fuse chip. FIG. 1 shows a planar structure of a memory core chip MC of the stacked memory, and FIG. 2 shows a planar structure of a fuse chip HC of the stacked memory. The memory core chip MC shown in FIG. 1 has a memory cell array area R1 divided into a plurality of areas, and has a through electrode area R2 and a test pad area R3 which are arranged between areas of the memory cell array area R. Each of four unit areas into which the memory cell array area R1 is divided forms a mat, and each mat includes the same number of memory cells. A large number of through electrodes for mutually connecting between chips of the stacked memory in a stacking direction are formed in the through electrode area R2. A large number of test pads used in a test of the memory core chips MC are formed in the test pad area R3.

Meanwhile, the fuse chip HC shown in FIG. 2 has a fuse area R10 in which a large number of fuses are disposed, and a through electrode area R11. A redundancy cell control circuit and all fuses, which are related to a redundancy cell operation described later for the memory core chips MC, are provided in the fuse area R10. The number of fuses in the fuse area R10 in this case is determined depending on the stacking number of the memory core chips MC. In the first embodiment, since the stacking number of the memory core chips MC is assumed to two, the number of fuses of the fuse chip HC is twice the number of fuses required in one memory core chip MC. Meanwhile, the through electrode area R11 is arranged, whose position and size in a stacked state are common to those of the through electrode area R2 of FIG. 1. Here, the fuse chip HC shown in FIG. 2 has the same size and shape as the memory core chip MC shown in FIG. 1.

In the first embodiment, it is a feature that the fuses and the redundancy cell control circuit related to the redundancy cell operation, which are usually included in a general DRAM having the same function, are removed from the memory core chip MC of FIG. 1 while the fuse unit and the redundancy cell control circuit are mounted on the fuse chip HC of FIG. 2. Here, when comparing the memory core chip MC of FIG. 1 with the memory core chip Cb for the conventional stacked memory as shown in FIG. 12B, the fuse area Rb is not required to be provided. Therefore, chip size can be reduced by an area α shown at the left end of FIG. 1 in comparison with FIG. 12B. Since other memory core chips MC and the fuse chip HC have the same size, an area of the stacked memory can be entirely reduced.

Figure 3A:
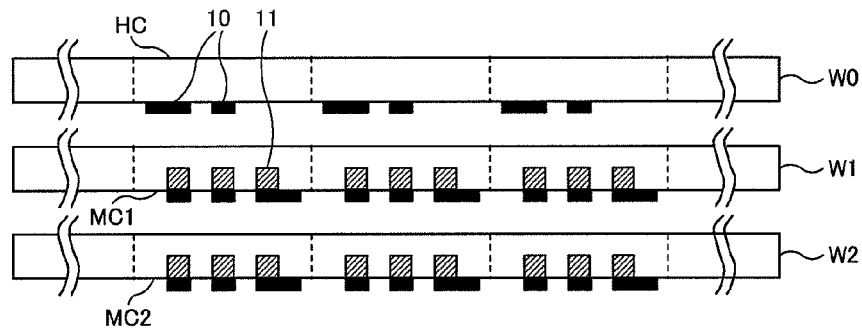
FIGS. 3A to 3D are diagrams showing the structure and stacking process of the stacked memory of the first embodiment.

Next, the structure and stacking process of the stacked memory of the first embodiment will be described with reference to FIGS. 3A to 3D and 4. Hereinafter, a case will be exemplified in which the above two types of chips are stacked in a three-layer structure. In the case as shown in FIG. 3A, one fuse wafer W0 of the uppermost layer and two memory core wafers W1 and W2 of lower layers are stacked to form a plurality of stacked memories. Each of the stacked memories has a fuse chip HC of the uppermost layer and two memory core chips MC1 and MC2, which are formed at the same position in a stacking direction. FIG. 3A shows a range including three fuse chips HC of the fuse wafer W0, three memory core chips MC1 of the memory core wafer W1, and three memory core chips MC2 of the memory core wafer W2, however there are actually a larger number of chips. Circuit portions 10 including circuit elements, wirings and the like are formed in the fuse chip HC, while circuit portions 10 and through electrodes 11 are formed in the memory core chips MC1 and MC2.

Figure 4:
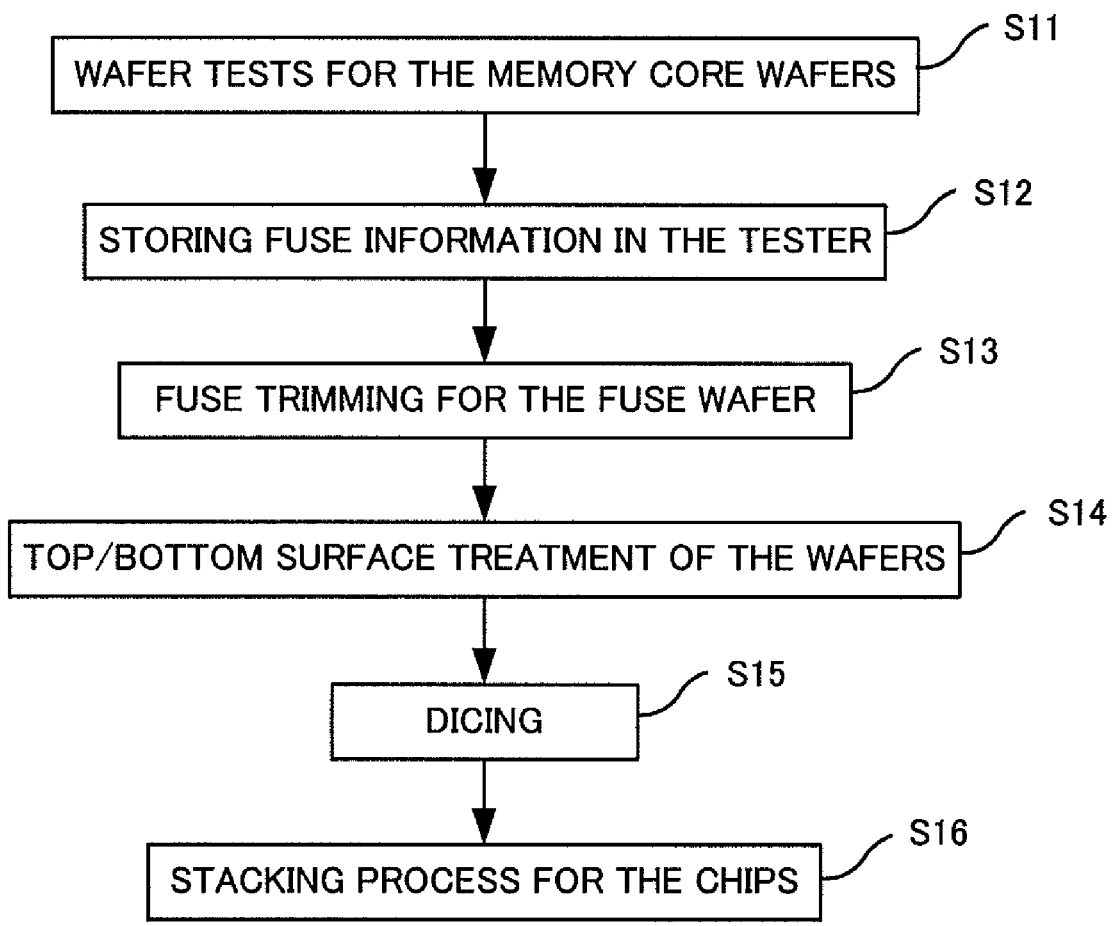
FIG. 4 is a flow chart explaining the stacking process of the stacked memory of the first embodiment.

As shown in a flow chart of FIG. 4, wafer tests for the memory core wafers W1 and W2 are performed first (Step S11). At this point, fuse information (state information) required for fuse trimming in replacing defective memory cells is stored in a tester (Step S12). Subsequently, trimming for the fuse chips HC of the fuse wafer W0 is performed (Step S13). The trimming for the fuse chips HC needs to be performed based on information corresponding to lower stacked memory core chips MC1 and MC2 of the memory core wafers W1 and W2. Therefore, respective chips HC, MC1 and MC2 having the same coordinates in the wafers W0, W1 and W2 are sequentially stacked, and the trimming is performed corresponding to the memory core chips MC1 and MC2 having the same coordinates as the fuse chip HC. In the trimming, information indicating, for example, defective chips not to be used, can be added.

Figure 3B:
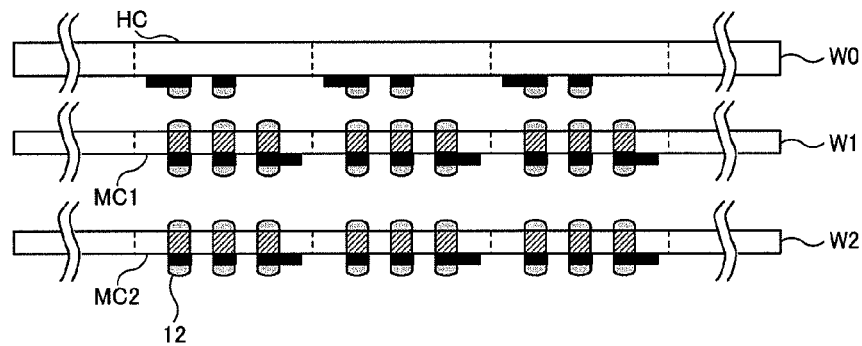
Figure 3C:
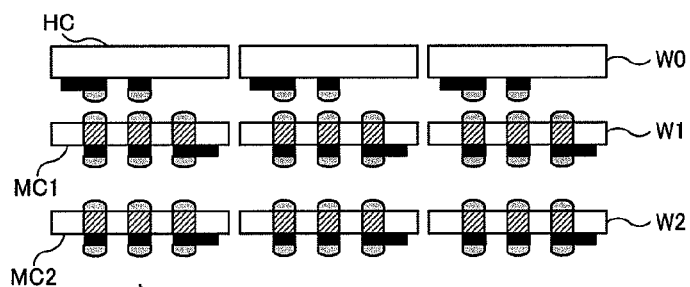
Figure 3D:
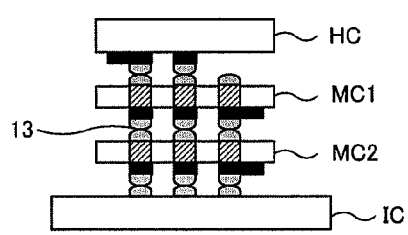

Subsequently, surface treatment for top and bottom surfaces required for stacking the fuse wafer W0 and the memory core wafers W1 and W2 is performed (Step S14). As shown in FIG. 3B, electrodes 12 for external connection are formed on the fuse chip HC and the memory core chips MC1 and MC2 respectively. Thereafter, the fuse wafer W0 and the memory core wafers W1 and W2 are diced (Step S15) and separated into respective stacked memories as shown in FIG. 3C. Finally, stacking process of the fuse chip HC and the memory core chips MC1 and MC2 is performed (Step S16). As shown in FIG. 3D, the fuse chip HC, the memory core chip MC1 and the memory core chip MC2 are stacked in this order from top to bottom, and further an interposer chip (IC) functioning as an interconnection circuit board is stacked at the lowermost layer so that the stacked memory of the first embodiment is completed. At this point, the electrodes 12 of the chips located at the same coordinates on the chips are connected to form chip-to-chip connection portions 13.

Figure 5:
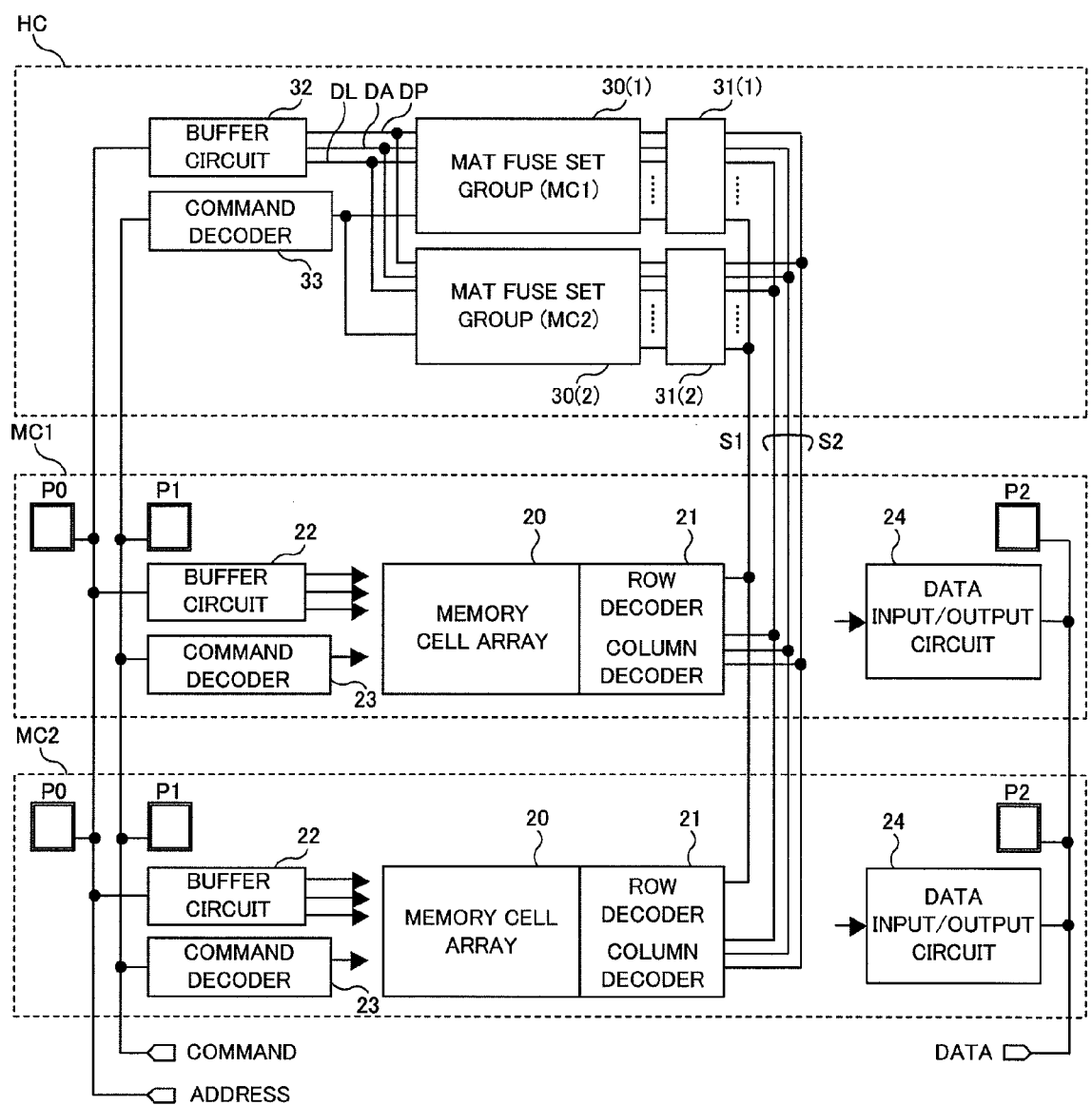
FIG. 5 is a block diagram showing an entire configuration of the stacked memory of the first embodiment.

Next, configuration and operation of the stacked memory of the first embodiment will be described. FIG. 5 is a block diagram showing an entire configuration of the stacked memory of the first embodiment, in which schematic configurations of the fuse chip HC, the memory core chip MC1 and the memory core chip MC2 are shown. Each of the memory core chips MC1 and MC2 includes a memory cell array 20, a row/column decoder 21, a buffer circuit 22, a command decoder 23, a data input/output circuit 24, and wafer test pads P0, P1 and P2.

In the above configuration, the memory cell array 20 includes a large number of memory cells for storing data. An arbitrary memory cell of the memory cell array 20 is arranged at an intersection of a row select line and a column select line corresponding to a designated address, and can be selected by the row/column decoder 21. The buffer circuit 22 acquires an address inputted from outside, and the command decoder 23 acquires a command inputted from outside and decodes it. The data input/output circuit 24 reads/writes data of the memory cell array 20 and transmits the data from/to outside. The wafer test pad P0 is connected to an address bus, and the wafer test pad P1 is connected to a command bus. Further, the wafer test pad P2 is connected to a data bus.

Meanwhile, the fuse chip HC includes two mat fuse set groups 30, two detection signal OR circuit groups 31, a buffer circuit 32, and a command decoder 33. Among these, each of the mat fuse set groups 30 includes a plurality of fuse elements and part of a redundancy cell control circuit (a fuse unit 42 and a fuse information determination circuit 43, as described later) which are required for replacing defective memory cells with spare memory cells for each mat of the memory cell array 20 in the memory core chips MC1 and MC2. Each of the detection signal OR circuit groups 31 generates a mat total replacement determination signal S1 and spare replacement notification signals S2, which are used in the redundancy cell operation, based on a state of each of the mat fuse set groups 30. The mat total replacement determination signal S1 and the spare replacement notification signals S2 are sent through the through electrodes 11 as control signals for the memory core chips MC1 and MC2. In FIG. 5, a mat fuse set group 30(1) and a detection signal OR circuit group 31(1) which are corresponded to one memory core chip MC1, and a mat fuse set group 30(2) and a detection signal OR circuit group 31(2) which are corresponded to the other memory core chip MC2, are arranged side by side.

Further, the buffer circuit 32 and the command decoder 33 function in the same manner as the buffer circuit 22 and the command decoder 23 of the memory core chips MC1 and MC2. Here, the buffer circuit 32 generates selected layer information DL, a selected address DA and selected plate information DP and outputs them to each of the mat fuse set groups 30 based on the acquired address. The selected layer information DL is information for selecting either of the two memory core chips MC1 and MC2. The selected address information DA is information for selecting an address of the memory cell array 20. The selected plate information DP is information for selecting a later-described plate of the memory cell array 20.

Figure 6:
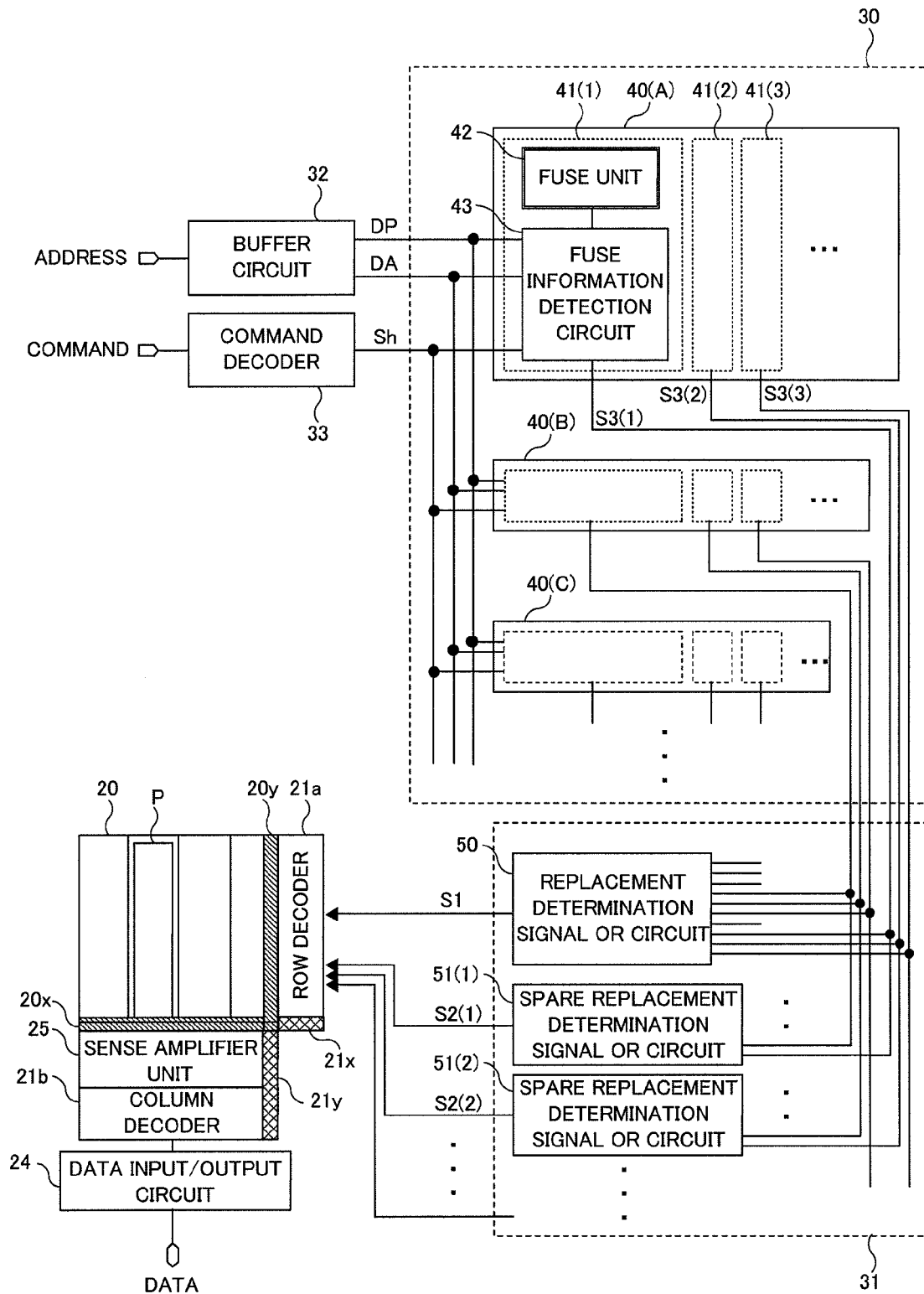
FIG. 6 is a block diagram showing a configuration of a set of a mat fuse set group and a detection signal OR circuit group in the entire configuration of FIG. 5.

FIG. 6 is a block diagram showing a configuration of a set of the mat fuse set group 30 and the detection signal OR circuit group 31 in the entire configuration of FIG. 5. FIG. 6 exemplifies a configuration corresponding to one mat of the memory cell array 20, however the entire memory core chip MC1 is actually divided into a plurality of mats such as 8 mats or 16 mats. In the following description of the first embodiment, the redundancy cell operation in which the defective memory cells are replaced with the spare memory cells based on a determination result of the fuse information will be specifically described. The purpose is to relieve defective sense amplifiers, defective row select lines, defective column select lines, as well as to relieve the defective memory cells. The number of addresses and the number of fuses required for the redundancy cell operation are determined depending on the specification of the DRAM, and one example thereof will be shown in the following description.

In the bottom left of FIG. 6, one memory cell array 20 is shown, and also a row decoder 21a, a column decoder 21b, a sense amplifier unit 25 and a data input/output circuit 24 which are disposed around the memory cell array 20 are shown. The memory cell array 20 configured for one mat is partitioned into a plurality of plate areas P. An access to the memory cell array 20 is controlled so that one row select line selected by the row decoder 21a and one column select line selected by the column decoder 21b are to be in a selected state respectively. Spare memory cells used in the redundancy cell operation are disposed in spare areas 20x and 20y of the memory cell array 20. Further, a spare row decoder 21x is disposed at one end of the row decoder 21a, and a spare column decoder 21y is disposed at one end of the column decoder 21b. Spare row select lines extending to the spare area 20y are connected to the spare row decoder 21x.

When accessing a spare memory cell in the spare area 20x of the memory cell array 20, the spare row decoder 21x and the column decoder 21b are used. Further, when accessing a spare memory cell in the spare area 20y of the memory cell array 20, the row decoder 21a and the spare column decoder 21y are used. When the defective memory cell is replaced with the spare memory cell, the spare memory cell can be selected by controlling a spare row select line to be in a selected state by the spare row decoder 21x while controlling normal row select lines to be in a non-selected state. Alternatively, the spare memory cell in the spare area 20y can be selected by the spare column decoder 21y by controlling normal column select lines to be in a non-selected state.

Meanwhile, the mat fuse set group 30 in FIG. 6 is divided into a plurality of plate fuse set groups 40 corresponding to the partition of the plates of the memory cell array 20. For convenience, only three plate fuse set groups 40(A), 40(B) and 40(C) are shown in FIG. 6. Further, each of the plate fuse set groups 40 includes a plurality of fuse sets 41. For example, if the plate fuse set group 40 includes N fuse sets 41, the respective fuse sets are denoted as fuse sets 41(1), 41(2), 41(3) to 41(N). In addition, the number N of fuse sets included in the plate fuse set group 40 corresponds to the number of spare memory cells prepared for each plate of the memory cell array 20.

Each fuse set 41 includes a fuse unit 42 including ten fuses and a fuse information determination circuit 43. Nine fuses corresponding to nine bits forming an address and one determination fuse for determining the necessity of the replacement are included in the ten fuses of the fuse unit 42. Here, the number N=10 of fuses in the fuse unit 42 is an example, and can be set depending on an address configuration of the specification of the DRAM. The fuse information determination circuit 43 determines fuse information (state information of fuses) for the fuse unit 42 based on the selected plate information DP and the selected address information DA which are inputted from the buffer circuit 32. In the fuse information determination circuit 43, the above information is acquired from the buffer circuit 32 at a predetermined timing based on a fuse state acquisition timing control signal Sh outputted from the command decoder 33.

Each fuse set 41 generates a spare replacement determination signal S3 based on a determination result of the fuse information determination circuit 43 and outputs it to the detection signal OR circuit group 31. Here, the fuse information determination circuit 43 and the detection signal OR circuit group 31 integrally function as the redundancy cell control circuit of the present invention. In FIG. 6, each of the fuse sets 41 included in the plate fuse set group 40 outputs the spare replacement determination signal S3. Spare replacement determination signals S3(1) to S3(N) are corresponded to fuse sets 41(1) to 41(N) respectively.

The detection signal OR circuit group 31 includes replacement determination signal OR circuits 50 receiving all spare replacement determination signals S3, and spare replacement determination signal OR circuits 51(i) receiving spare replacement determination signals S3(i), the number of which corresponds to the number of plates of an i-th fuse set 41(i). When N fuse sets 41 are provided for each plate, one replacement determination signal OR circuit 50 and N spare replacement determination signal OR circuits 51 are provided. The replacement determination signal OR circuit 50 generates a mat total replacement determination signal S1 based on a logical sum operation of the input signals. The i-th spare replacement determination signal OR circuit 51(i) generates a spare replacement notification signal S2(i) based on a logical sum operation of the input signals. The signals S1 and S2 as the control signals are supplied to the row decoder 21a of the memory cell array 20 through the through electrodes 11.

In the above configuration, a process of cutting fuses of the fuse unit 42 will be described. First, in a preliminary wafer test, an acceptance test for the memory cell array 20 is performed. At this time, an address of a memory cell whose operation has failed is stored in the tester. Subsequently, in a fuse cutting process, fuses designated by a program is cut in order to replace a defect address stored in the tester with the spare row select line. At this point, both connection nodes of the cut fuse become a non-conductive state.

In the redundancy cell operation to replace the spare memory cell with the memory cell in the memory cell array 20, an address acquired to the fuse chip HC from outside is latched in the buffer circuit 32, and thereafter is sent as the address information DA to the fuse information determination circuit 43 of FIG. 6. The fuse information determination circuit 43 determines whether or not all fuses corresponding to a row address included in the selected address information DA are cut. When all fuses corresponding to the row address are cut and a determination fuse for determining the necessity of the replacement is also cut, a corresponding spare replacement determination signal S3 is outputted.

For example, if the spare replacement determination signal S3(1) is outputted from the fuse set 41(1) of a certain plate fuse set group 40, then in the determination circuit OR circuit group 31, the mat total replacement determination signal S1 becomes 1, the spare replacement notification signal S2(1) becomes 1, and the spare replacement notification signal S2(2) becomes 0, respectively, when the certain spare replacement determination signal S3(1) is 1. Here, the mat total replacement determination signal S1 is a signal based on a logical sum operation of all the spare replacement determination signals S3. That is, when either of the spare replacement determination signals S3 becomes 1, the mat total replacement determination signal S1 becomes 1. The function of the mat total replacement determination signal S1 is to allow a selected row select line to be in a non-operative state.

Meanwhile, the spare replacement notification signal S2 is a signal based on a logical sum operation of the spare replacement determination signals S3 for all plates. That is, when using a row select line corresponding to the i-th fuse set 41(i), the spare replacement notification signal S2(i) becomes 1. The function of the spare replacement notification signal S2 is to allow a spare row select line used in the redundancy cell operation to be in an operative state. At this point, if the replacement corresponding to the fuse set 41(1) is set, a row address included in the selected address information DA does not conform with information based on the fuse unit 42 in the fuse set 41(2). Therefore, the replacement corresponding to the fuse set 41(2) is not performed, and the spare replacement notification signal S2(2) is maintained at 0.

The mat total replacement determination signal S1 is inputted to the row decoder 21a, and the row decoder 21a is controlled to be in a non-selected state when S1=1. A row select line corresponding to the fuse set 41(1) is in a selected state when the spare replacement notification signal S2(1) is 1. At this point, the plate selection in the memory cell array 20 is performed based on a plate selection address decode signal.

Next, a situation will be considered where there are uncut fuses among the fuses corresponding to the row address in a determination result of the fuse information determination circuit 43. In this situation, for example, when all spare replacement determination signals S3(1) from the fuse sets 41(1) for each plate are 1, the mat total replacement determination signal S1 becomes 0 and all of N spare replacement notification signals S2(1) to S2(N) corresponding to the fuse sets 41(1) to 41(N) become 0. Thereby, the row decoder 21a receives the mat total replacement determination signal S1 which is equal to 0, a row select line selected by a normal operation is in a selected state. Meanwhile, since the spare replacement notification signal S2 is 0, the spare row select lines are in a non-selected state.

In the above-described redundancy cell operation using the spare memory cells, the number of chip-to-chip connection signals between two memory core chips MC and the fuse chip HC can be small. This is a structural advantage due to the configuration in which the redundancy cell control circuit required for determining the fuse to be cut and performing the replacement is mounted on the fuse chip HC, as well as the fuse unit 42. In the following, description of this advantage will be specifically made.

If a structure for mounting only fuse elements on the fuse chip HC is employed, state information of fuses needs to be sent from the fuse chip HC to the memory core chip MC. Since 1000 or more fuse elements are provided for one mat of the memory cell array 20, the same number of chip-to-chip connection signals are required. Since the through electrodes used for chip-to-chip connection are arranged with a gap of about 50 μm, a large area for arranging the 1000 or more through electrodes is required. This area considerably exceeds a reducible area for fuses, and therefore it is difficult to achieve the configuration provided with about 1000 chip-to-chip connection signals.

Accordingly, the first embodiment employs the configuration in which part of a circuit for controlling the fuse elements is mounted on the fuse chip HC so as to reduce the number of the chip-to-chip connection signals. In the first embodiment, the address and command inputted to the memory core chip MC from outside need to be sent to the fuse chip HC. The chip-to-chip connection corresponding to such a configuration can be relatively easily formed. Meanwhile, as described above, the number of fuses required for replacing one row select line with a corresponding spare row select line is ten in total, which is a sum of nine corresponding to a 9-bit address and one corresponding to the determination fuse, and each spare replacement determination signal S3 is generated based on the ten pieces of the fuse information. Since about 100 spare replacement determination signals S3 are generally required for one mat, it is undesirable to employ the configuration for sending the spare replacement determination signals S3 from the fuse chip HC to the memory core chip MC, because this causes an increase in the number of the chip-to-chip connection signals, as described above. Due to the configuration of the first embodiment, the spare replacement determination signals S3 are sent from the mat fuse set groups 30 in the fuse chip HC to the detection signal OR circuit group 31, thereby avoiding an increase in the number of the chip-to-chip connection signals.

In the first embodiment, the number of the chip-to-chip connection signals between the fuse chip HC and the memory core chips MC will be described. In the memory cell array 20 of FIG. 6, a row selection operation using the spare row select line and a column selection operation using the spare column select line are both assumed. In this case, four types of signals including mat total replacement determination signals S1a for row selection determining the operation of normal row select lines, spare replacement notification signals S2a for row selection determining the operation of the spare column select lines, mat total replacement determination signals S1b for column selection determining the operation of normal column select lines, and spare replacement notification signals S2b for column selection, need to be supplied to the memory cell array 20.

Regarding the four types of signals, at least one mat total replacement determination signal S1a for row selection and at least one mat total replacement determination signal S1b for column selection are required respectively. Additionally, the number of the spare replacement notification signals S2a for row selection needs to be the same as that of the spare row select lines per plate, and the number of the spare replacement notification signals S2b for column selection needs to be the same as that of the spare column select lines per plate. In the first embodiment, the former is assumed to be 8 and the latter is assumed to be 4. Here, the number of the spare column select lines is smaller than the number of the spare row select lines. This is based on a difference between replacement methods in a plate for the row select line and the column select line, and specific description of the difference is omitted.

Since the number of the above four types of signals comes to a grand total of 14, the number of the chip-to-chip connection signals between the fuse chip HC and the memory core chips MC is 14, in the first embodiment. In this manner, by employing the configuration of the first embodiment, a remarkably small number (14) of the chip-to-chip connection signals can be achieved, so that the conventional problems can be solved.

In addition, the number of the spare replacement notification signals S2 changes according to the number of the spare select lines provided in the memory cell array 20. However, since the number of the spare select lines generally corresponds to several per plate, a drastic increase in the number of the chip-to-chip connection signals can be avoided. Further, if the number of the chip-to-chip connection signals is slightly increased due to an increase in the number of the spare select lines, a desired number of the chip-to-chip connection signals can be maintained by devising the circuit configuration or the control.

Second Embodiment

Figure 7:
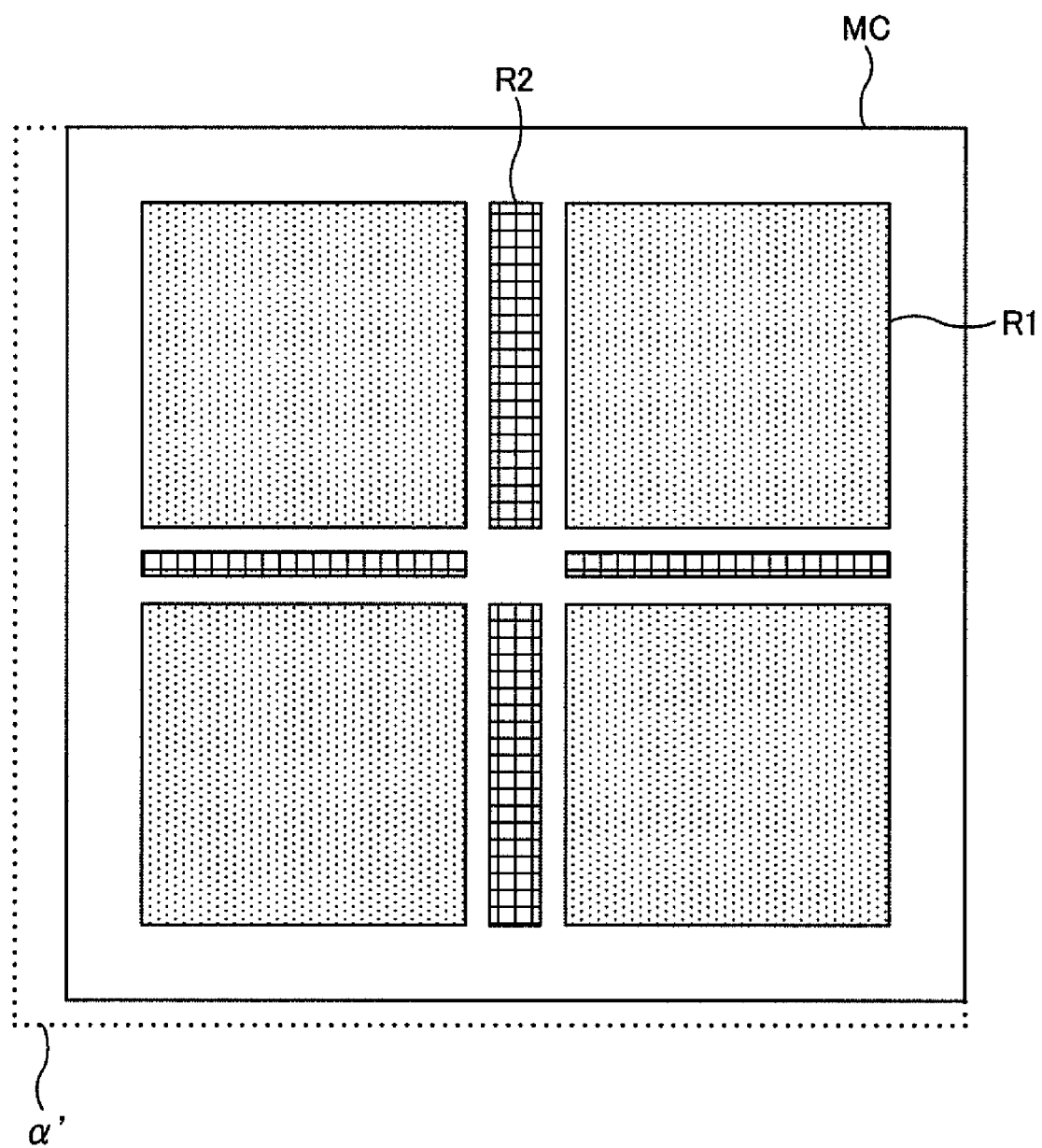
FIG. 7 is a diagram showing a planar structure of a memory core chip of a second embodiment.
Figure 8:
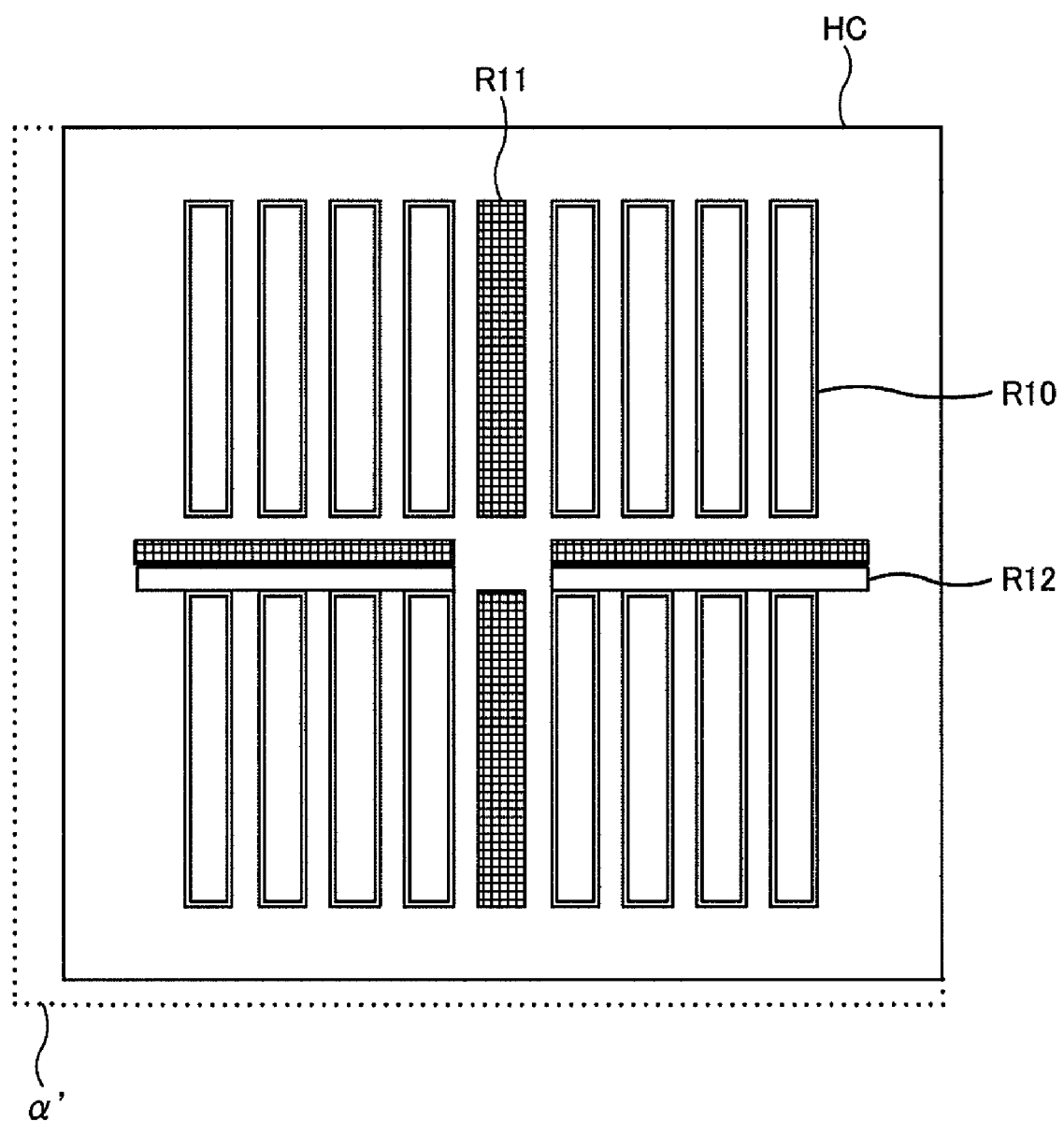
FIG. 8 is a diagram showing a planar structure of a fuse chip of the stacked memory of the second embodiment.

A stacked memory of the second embodiment is based on the stacked memory of the first embodiment and is characterized that wafer stacking technique is applied thereto. In the stacked memory of the second embodiment, FIG. 7 shows a planar structure of the memory core chip MC, and FIG. 8 shows a planar structure of the fuse chip HC. The memory core chip MC shown in FIG. 7 has the memory cell array area R1 divided into a plurality of areas, and has the through electrode area R2 which are arranged between areas of the memory cell array area R1. Meanwhile, the fuse chip HC of FIG. 8 has a test pad area R12 in addition to the fuse area R10 and the through electrode area R11. Accordingly, when comparing FIGS. 7 and 8 with FIGS. 1 and 2 of the first embodiment, it is understood that the test pad area R3 (FIG. 1) is not provided on the memory core chip MC and the test pad area R12 is provided on the fuse chip HC. In addition, functions of the respective areas in FIGS. 7 and 8 are the same as those in FIGS. 1 and 2.

Figure 12A:
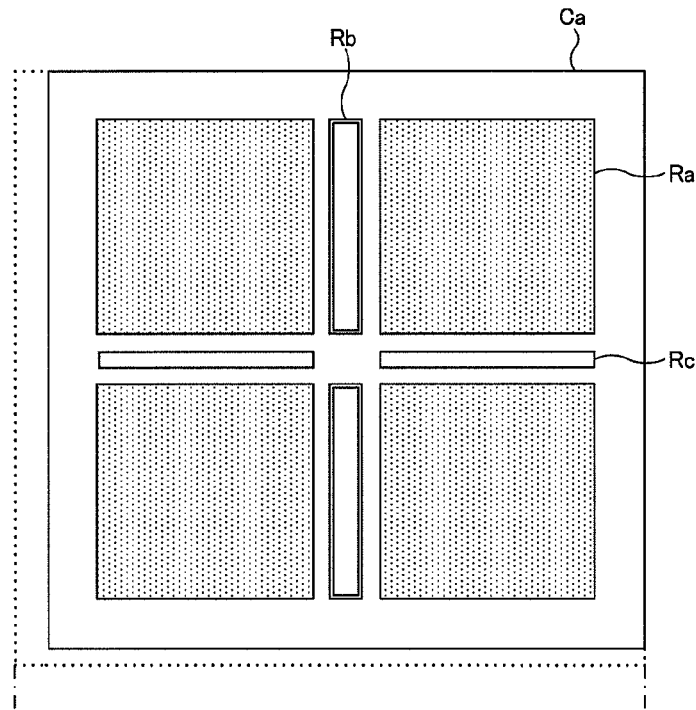
FIGS. 12A and 12B are diagrams showing a planar structure of memory core chips stacked in a conventional stacked memory.
Figure 12B:
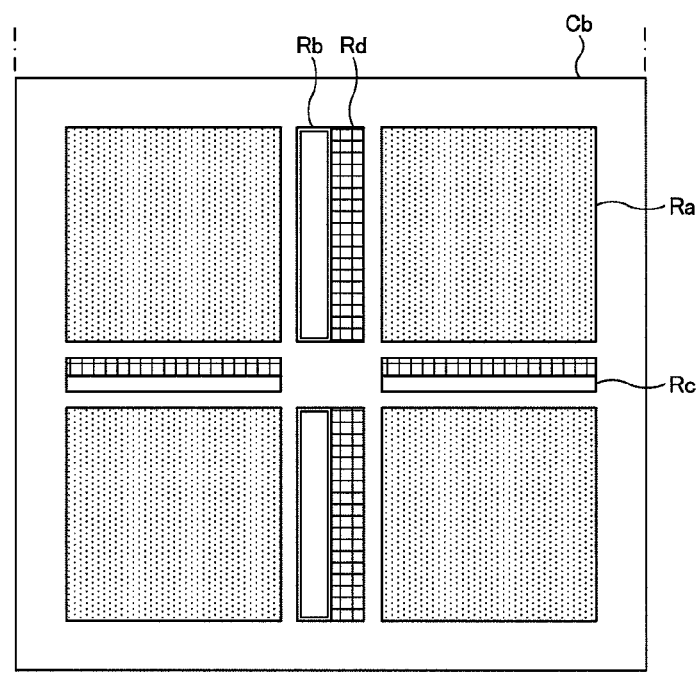
Figure 13A:
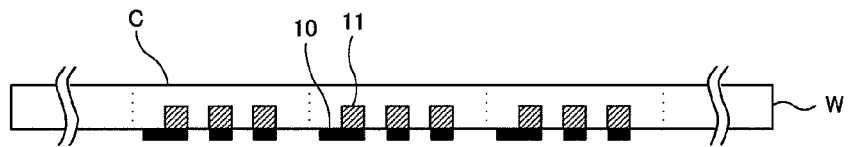
FIGS. 13A to 13D are diagrams showing a structure of the memory core chip stacked in the conventional stacked memory.
Figure 13B:
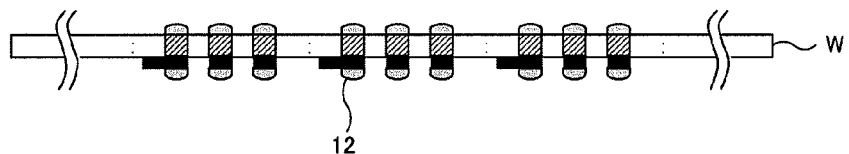
Figure 13C:
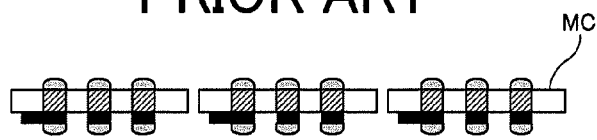
Figure 13D:
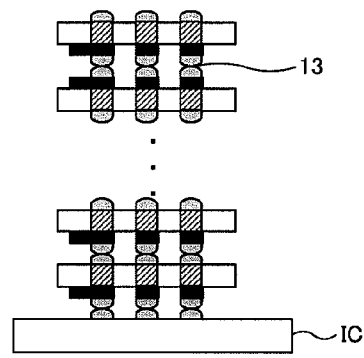

Here, when comparing the memory core chip MC of FIG. 7 with the memory core chip Cb for the conventional stacked memory shown in FIG. 12B, the chip size can be reduced by an α' indicated at left and bottom ends in FIG. 7, so that the memory core chip MC can be formed with the same size as the normal memory core chip MC of FIG. 12A. In addition, the fuse chip HC of FIG. 8 has the same size as the memory core chip MC of FIG. 7. In the stacked memory of the second embodiment, since the area for the test pad area R3 is unnecessary in the memory core chip MC in comparison with the stacked memory of the first embodiment, the entire chip size can be further reduced.

Figure 9A:
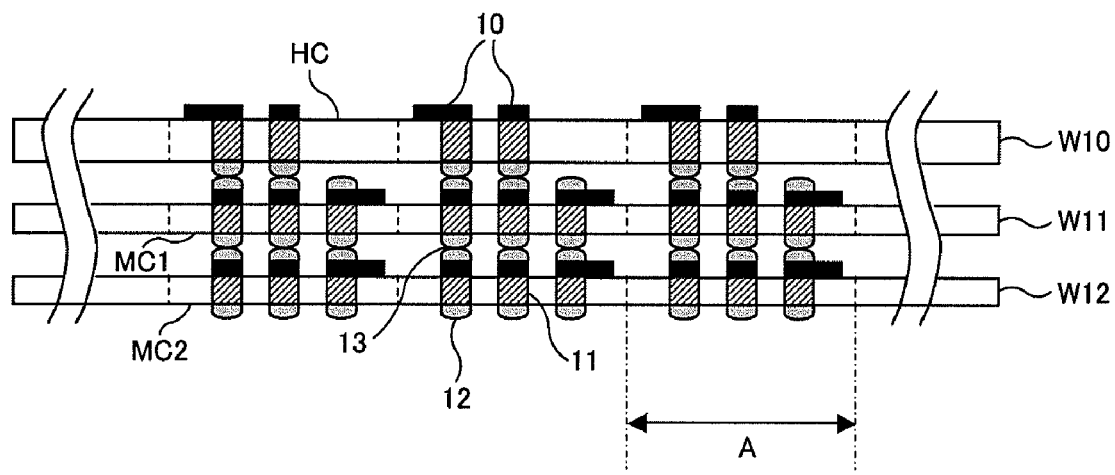
FIGS. 9A and 9B are diagrams showing the structure and stacking process of the stacked memory of the second embodiment.

Next, structure and stacking process of the stacked memory of the second embodiment will be described with reference to FIGS. 10 and 11. In the second embodiment, a case will be exemplified in which the stacked memory has a three-layered structure as in the first embodiment. As shown in FIG. 9A, one fuse wafer W10 of the uppermost layer and two memory core wafers W11 and W12 of lower layers are stacked. Then, the stacked memory is formed with the fuse chip HC of the uppermost layer and the two memory core chips MC1 and MC2 of the lower layers, which are stacked at a position overlapping in a stacking direction.

Figure 10:
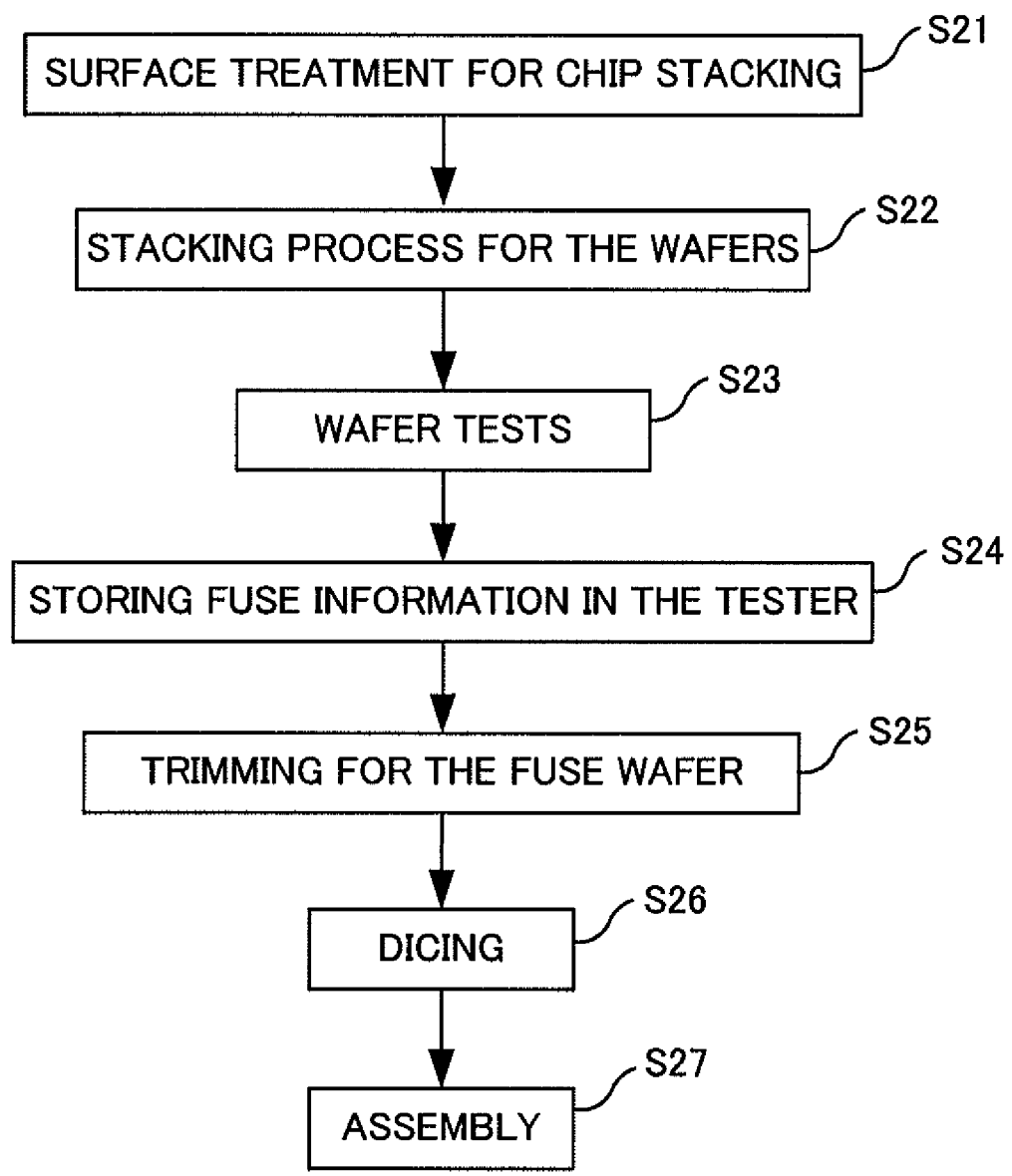
FIG. 10 is a flow chart explaining the stacking process of the stacked memory of the second embodiment.

As shown in a flow chart of FIG. 10, surface treatment for the fuse wafer W10 and the memory core wafers W11 and W12 is performed prior to stacking process thereof (Step S21). Subsequently, the fuse wafer W10 is placed in a state where its fuse surface faces upward, and the memory core wafers W11 and W12 are stacked under the fuse wafer W10 (Step S22). In this stacked state, wafer tests for the memory core wafers W1 and W2 are performed (Step S23). At this point, fuse information required for fuse trimming in replacing defective memory cells is stored in the tester (Step S24). Subsequently, trimming for the fuse wafer W10 is performed (Step S25).

Figure 9B:
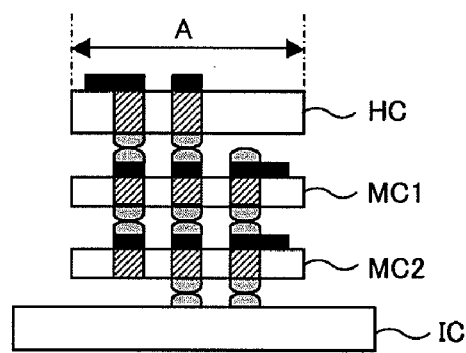

Thereafter, the fuse wafer W10 and the memory core wafers W11 and W12 are diced (Step S26). Thereby, portions each having a lateral width A are separated each as the stacked memory, as shown in FIG. 9B. Here, the fuse chip HC and the memory core chips MC1 and MC2 included in the stacked memory have the same coordinates on each wafer, and the above trimming is performed based on the coordinates. When performing the trimming, information indicating, for example, that defective chips are not used, can be added. Finally, the fuse chip HC and the memory core chips MC1 and MC2 are assembled (Step S27), and the stacked memory of the second embodiment is completed.

Figure 11:
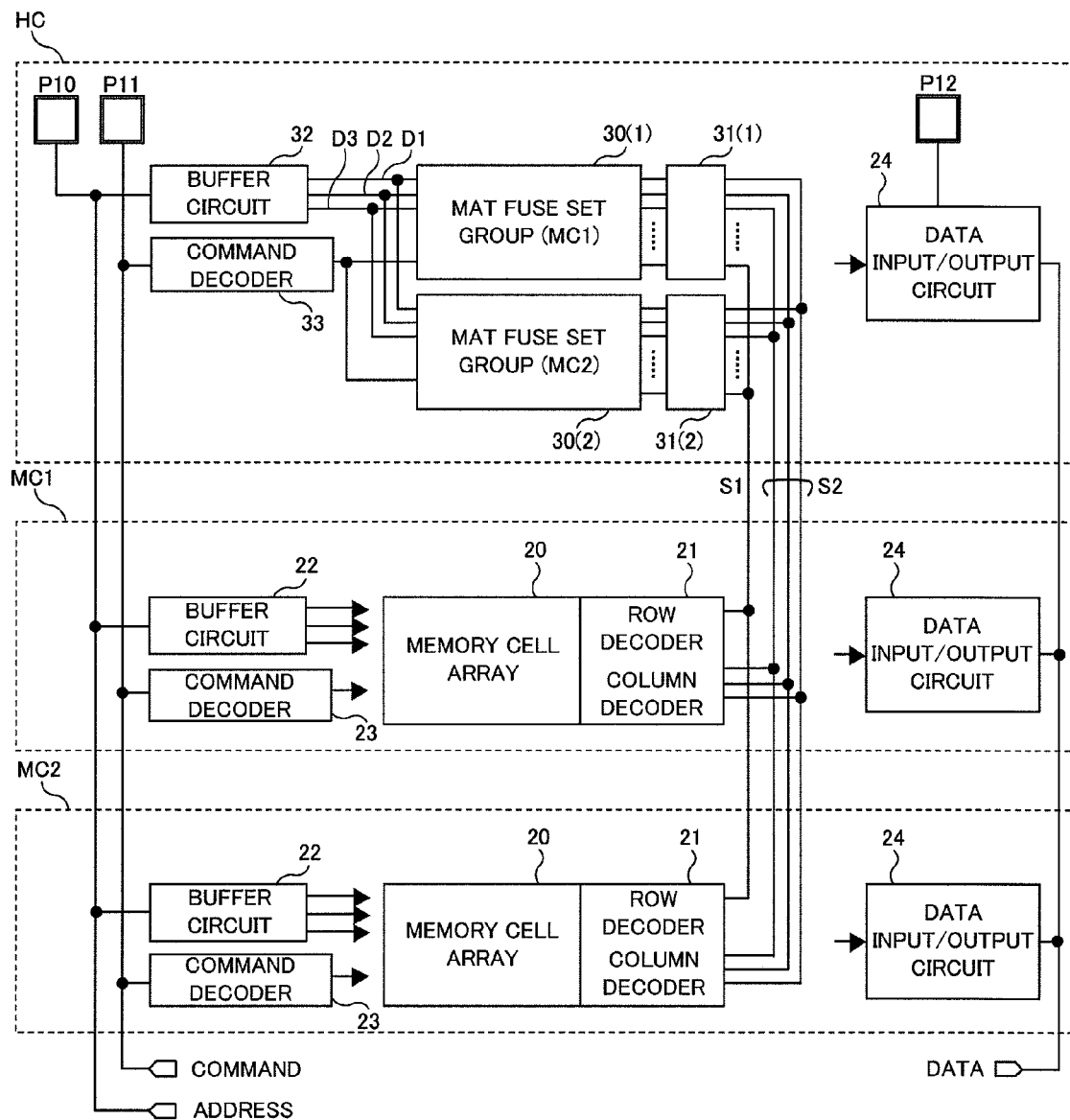
FIG. 11 is a block diagram showing an entire configuration of the stacked memory of the second embodiment.

FIG. 11 is a block diagram showing an entire configuration of the stacked memory of the second embodiment. In the configuration of FIG. 11, description of points common to FIG. 5 of the first embodiment will be omitted. In FIG. 11, it differs from FIG. 5 in that the wafer test pads P0, P1 and P2 are not provided on the memory core chips MC1 and MC2 and the wafer test pads P10, P11 and P12 are provided on the fuse chip HC. This is a difference reflecting the structure of the stacked memory of FIGS. 9A and 9B as described above.

In the foregoing, the stacked memory of the present invention has been described based on the first and second embodiments, however the present invention can be applied to various modifications. For example, on the premise of setting a unique chip ID for the memory core chip MC of the first embodiment, chip IDs for non-defective chips may be stored together with the fuse information. In this case, after selecting one of stacked memory core chips MC, trimming for the fuse chip HC using the chip ID of the selected memory core chip MC may be performed. Thereby, only non-defective chips can be selected in the stacked memory so as to improve the yield of the chips.

Further, in the description of the first and second embodiments, although the present invention is applied to the DRAM as the semiconductor memory device, the present invention is not limited to the DRAM and can be widely applied to a semiconductor memory device having a configuration for relieving defective memory cells. For example, the present invention can be applied to a semiconductor device such as SRAM or PRAM (phase change memory).

It is apparent that the present invention is not limited to the above embodiments, but may be modified and changed without departing from the scope and spirit of the invention.

What is claimed is:

1. A stacked memory comprising:
   one or more memory core chips, each of the chips having a memory cell array including spare memory cells for replacing defective memory cells; and
   a fuse chip having a fuse unit including a plurality of fuse elements, electrical states of the fuse elements corresponding to a defective address of a defective memory cell, and having a redundancy cell control circuit controlling a redundancy cell operation of the defective memory cell based on the electrical state of the fuse elements,
   wherein the fuse chip and the memory core chips are stacked in layers.

2. The stacked memory according to claim 1, wherein one or more control signals outputted from the redundancy cell control circuit is supplied to each of the memory core chips through one or more through electrodes.

3. The stacked memory according to claim 1, wherein the fuse chip is in an uppermost layer.

4. The stacked memory according to claim 1, wherein each of the memory core chips is a DRAM chip.

5. The stacked memory according to claim 1, wherein a redundancy cell operation of the defective memory cells is capable of being performed after being stacked.

6. The stacked memory according to claim 1, wherein the fuse chip has a plurality of the fuse units and the redundancy cell control circuit has a plurality of first detection circuits, and each of the first detection circuits is provided to be associated with each of the fuse units and determines whether an input address is a defective address or not based on the electric states of the fuse elements.

7. A stacked memory, comprising:
   one or more memory core chips, each of the chips having a memory cell array including spare memory cells for replacing defective memory cells; and
   a fuse chip having a fuse unit including a plurality of fuse elements, electrical states of the fuse elements corresponding to a defective address of a defective memory cell, and having a redundancy cell control circuit controlling a redundancy cell operation of the defective memory cell based on the electrical state of the fuse elements,
   wherein each of the memory core chips has a memory cell array area in which the memory cell array is formed and a through electrode area in which through electrodes are formed, and
   the fuse chip has a fuse area in which the fuse unit and the redundancy cell control circuit are formed and a through electrode area in which through electrodes are formed.

8. The stacked memory according to claim 7, wherein each of the memory core chips has a test pad area in which one or more test pads used in a test of the memory cell array are formed.

9. The stacked memory according to claim 7, wherein the fuse chip has a test pad area in which one or more test pads used in a test of the memory cell array are formed.

10. A stacked memory comprising:
    one or more memory core chips, each of the chips having a memory cell array including spare memory cells for replacing defective memory cells; and
    a fuse chip having a fuse unit including a plurality of fuse elements, electrical states of the fuse elements corresponding to a defective address of a defective memory cell, and having a redundancy cell control circuit controlling a redundancy cell operation of the defective memory cell based on the electrical state of the fuse elements, wherein one or more control signals outputted from the redundancy cell control circuit is supplied to each of the memory core chips through one or more through electrodes, and wherein the memory cell array is divided into a plurality of areas, and the fuse chip has a plurality of the fuse units and a plurality of the redundancy cell control circuits which correspond to each of the plurality of areas.

11. The stacked memory according to claim 10, wherein the redundancy cell control circuit includes a circuit for outputting a signal obtained from a logical sum of a plurality of the control signals supplied to the plurality of areas.

12. A stacked memory comprising:
one or more memory core chips, each of the chips having a memory cell array including spare memory cells for replacing defective memory cells; and
a fuse chip having a fuse unit including a plurality of fuse elements, electrical states of the fuse elements corresponding to a defective address of a defective memory cell, and having a redundancy cell control circuit controlling a redundancy cell operation of the defective memory cell based on the electrical state of the fuse elements,
wherein the fuse chip has a plurality of the fuse units and the redundancy cell control circuit has a plurality of first detection circuits, and each of the first detection circuits is provided to be associated with each of the fuse units and determines whether an input address is a defective address or not based on the electric states of the fuse elements, and
wherein the redundancy cell control circuit has a second detection circuit receiving output signals of the first detection circuits, and the second detection circuit activates an output signal thereof when at least one of the output signals of the first detection circuits is activated.

13. The stacked memory according to claim 12, wherein the plurality of the fuse units and the plurality of the first detection circuits are a first fuse group and the fuse chip further comprises a second fuse group having a plurality of the fuse units and a plurality of the first detection circuits and a third detection circuit, and the third detection circuit receives output signals of the first detection circuits in the first fuse group and the second fuse group and activates an output signal thereof when at least one of output signals of the first detection circuits in the first fuse group and the second fuse group is activated.

14. The stacked memory according to claim 13, wherein the memory core chips receive the output signals of the second detection circuit and the third detection circuit via a plurality of through electrodes.

15. A device comprising:
first and second chips provided independently of each other,
the first chip comprising on a single chip;
a first terminal receiving address information,
a second terminal,
a storing circuit configured to store a plurality of defective address information, and
a first control circuit coupled to the first and second terminals and the storing circuit and providing a first control signal to the second terminal when the address information coincides with one of the defective address information, and
the second chip comprising on a single chip different from the single chip of the first chip;
a third terminal electrically coupled to the first terminal,
a fourth terminal electrically coupled to the second terminal,
a first memory cell array including a plurality of normal memory cells and a plurality of redundant memory cells, and
a second control circuit coupled to the third and fourth terminals and the first memory cell array and accessing one or ones of the normal memory cells in response to the address information when the first control signal is not produced and accessing one or ones of the redundant memory cells when the first control signal is produced.

16. The device as claimed in claim 15, wherein the first and the second chips are stacked with each other.

17. The device as clamed in claim 15, wherein the first and the second chips are stacked with each other so that the first chip is located above the second chip.

18. The device as claimed in claim 15, wherein the storing circuit of the first chip includes a plurality of fuse elements.

19. The device as claimed in claim 15, wherein the second control circuit of the second chip accesses the one or ones of the redundant memory cells without accessing the one or ones of the normal memory cells.

* * * * *